(12) United States Patent
Vimercati

(10) Patent No.: US 11,545,205 B2
(45) Date of Patent: Jan. 3, 2023

(54) APPARATUSES, SYSTEMS, AND METHODS FOR FERROELECTRIC MEMORY CELL OPERATIONS

(71) Applicant: MICRON TECHNOLOGY, INC., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/998,928

(22) Filed: Aug. 20, 2020

(65) Prior Publication Data

US 2022/0059151 A1     Feb. 24, 2022

(51) Int. Cl.
| | | |
|---|---|---|
| *G11C 11/22* | (2006.01) | |
| *H01L 27/11514* | (2017.01) | |
| *H01L 27/11507* | (2017.01) | |

(52) U.S. Cl.
CPC ........ *G11C 11/2273* (2013.01); *G11C 11/221* (2013.01); *G11C 11/2257* (2013.01); *G11C 11/2275* (2013.01); *H01L 27/11507* (2013.01); *H01L 27/11514* (2013.01)

(58) Field of Classification Search
CPC ............ G11C 11/2273; G11C 11/2257; G11C 11/2275; G11C 11/22; G11C 11/5647; G11C 11/06035; G11C 11/06064; G11C 11/063; G11C 8/14; G11C 7/12; G11C 5/025; G11C 7/222; G11C 11/2255; G11C 29/74; H01L 27/11514; H01L 27/11507

See application file for complete search history.

(56) References Cited

U.S. PATENT DOCUMENTS

| | | | |
|---|---|---|---|
| 11,074,964 B1* | 7/2021 | Kawamura | ......... G11C 11/4085 |
| 11,127,744 B2 | 9/2021 | Servalli et al. | |
| 11,211,113 B1* | 12/2021 | Derner | ................ G11C 11/4074 |
| 2003/0053346 A1 | 3/2003 | Bruchhaus et al. | |

(Continued)

FOREIGN PATENT DOCUMENTS

| | | |
|---|---|---|
| TW | I327317 B | 7/2010 |
| TW | 201939497 A | 10/2019 |

OTHER PUBLICATIONS

"International Search Report and Written Opinion for PCT/US2021/045859, dated Dec. 6, 2021."

(Continued)

*Primary Examiner* — Tan T. Nguyen
(74) *Attorney, Agent, or Firm* — Dorsey & Whitney LLP

(57) ABSTRACT

Apparatuses, systems, and methods for ferroelectric memory (FeRAM) cell operation. An FeRAM cell may have different charge regions it can operate across. Some regions, such as dielectric regions, may operate faster, but with reduced signal on a coupled digit line. To improve the performance while maintaining increased speed, two digit lines may be coupled to the same sense amplifier, so that the FeRAM cells coupled to both digit lines contribute signal to the sense amplifier. For example a first digit line in a first deck of the memory and a second digit line in a second deck of the memory may both be coupled to the sense amplifier. In some embodiments, additional digit lines may be used as shields (e.g., by coupling the shield digit lines to a ground voltage) to further improve the signal-to-noise ratio.

28 Claims, 11 Drawing Sheets

(56) References Cited

U.S. PATENT DOCUMENTS

| | | |
|---|---|---|
| 2003/0223292 A1 | 12/2003 | Nejad et al. |
| 2013/0070506 A1* | 3/2013 | Kajigaya ............. H01L 27/2436 |
| | | 365/51 |
| 2014/0119090 A1* | 5/2014 | Ahn .................... G11C 11/4097 |
| | | 365/51 |
| 2014/0347912 A1* | 11/2014 | Siau .................... G11C 13/004 |
| | | 365/148 |
| 2016/0020255 A1 | 1/2016 | Ratnam et al. |
| 2019/0035464 A1* | 1/2019 | Kajigaya ............. G11C 11/4091 |
| 2020/0235111 A1 | 7/2020 | Calderoni et al. |
| 2021/0272620 A1 | 9/2021 | Barry |

OTHER PUBLICATIONS

English Translation of Office Action for Taiwanese Patent Appl. No. 110130768, dated Apr. 15, 2022; pp. all.

U.S. Appl. No. 17/189,594, titled "Memory Devices and Methods of Forming Memory Devices", filed Mar. 2, 2021, pp. all pages of application as field.

U.S. Appl. No. 17/661,348, titled "Apparatuses, Systems, And Methods For Ferroelectric Memory Celloperations", filed Apr. 29, 2022; pp. all pages of application as filed.

U.S. Appl. No. 17/732,885, titled "Apparatuses, Systems, And Methods For Configurable Memory", filed Apr. 29, 2022; pp. all pages of application as filed.

\* cited by examiner

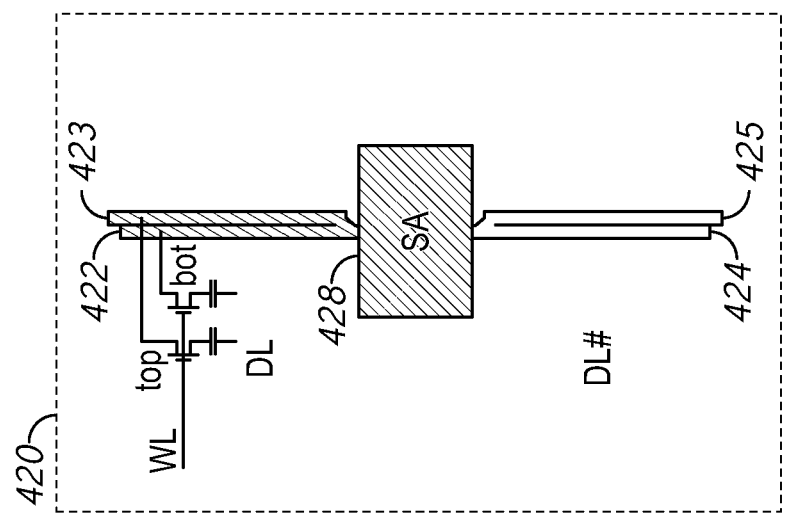
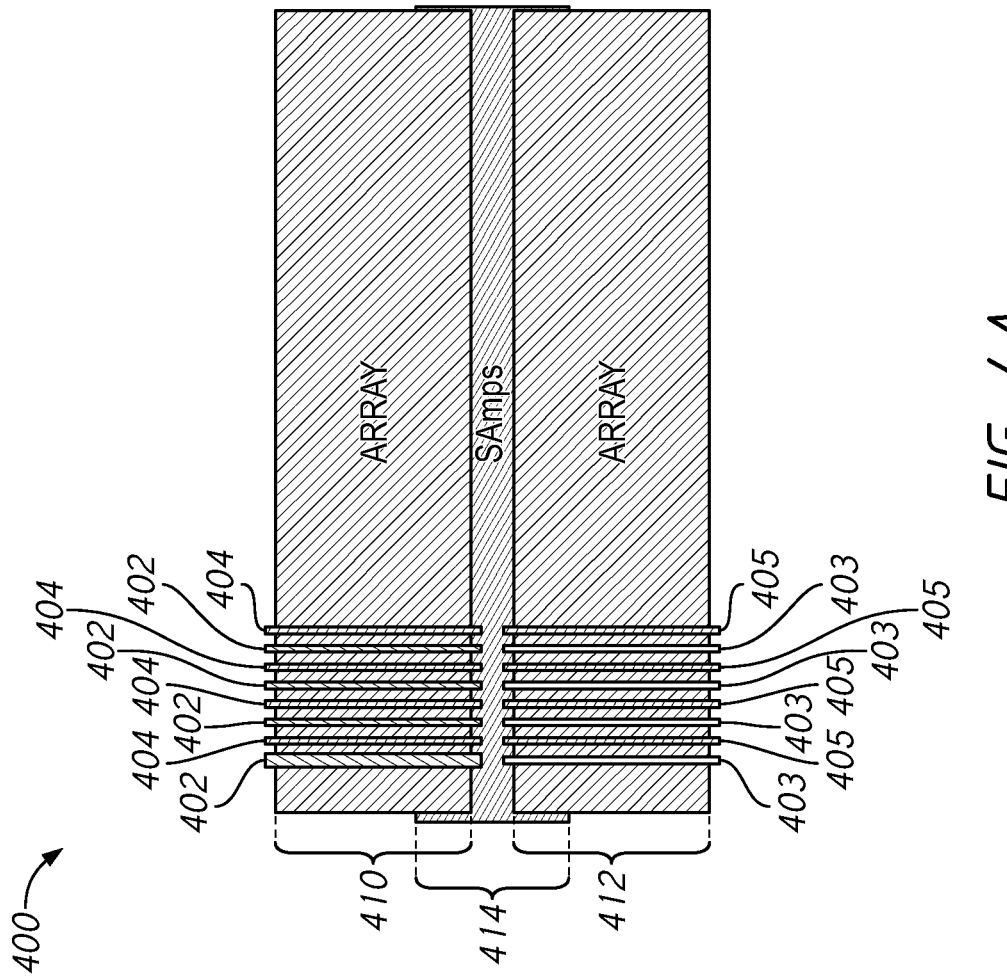
FIG. 4B
FIG. 4A

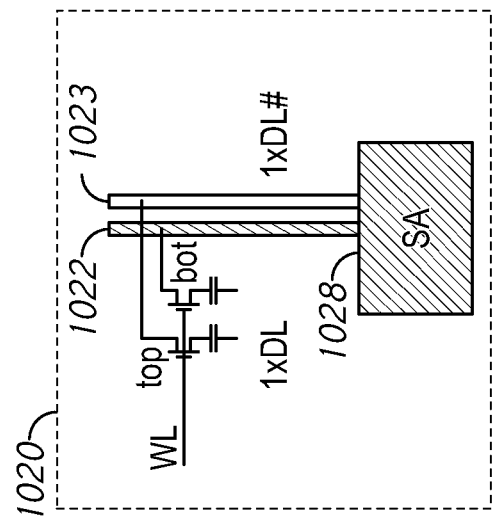
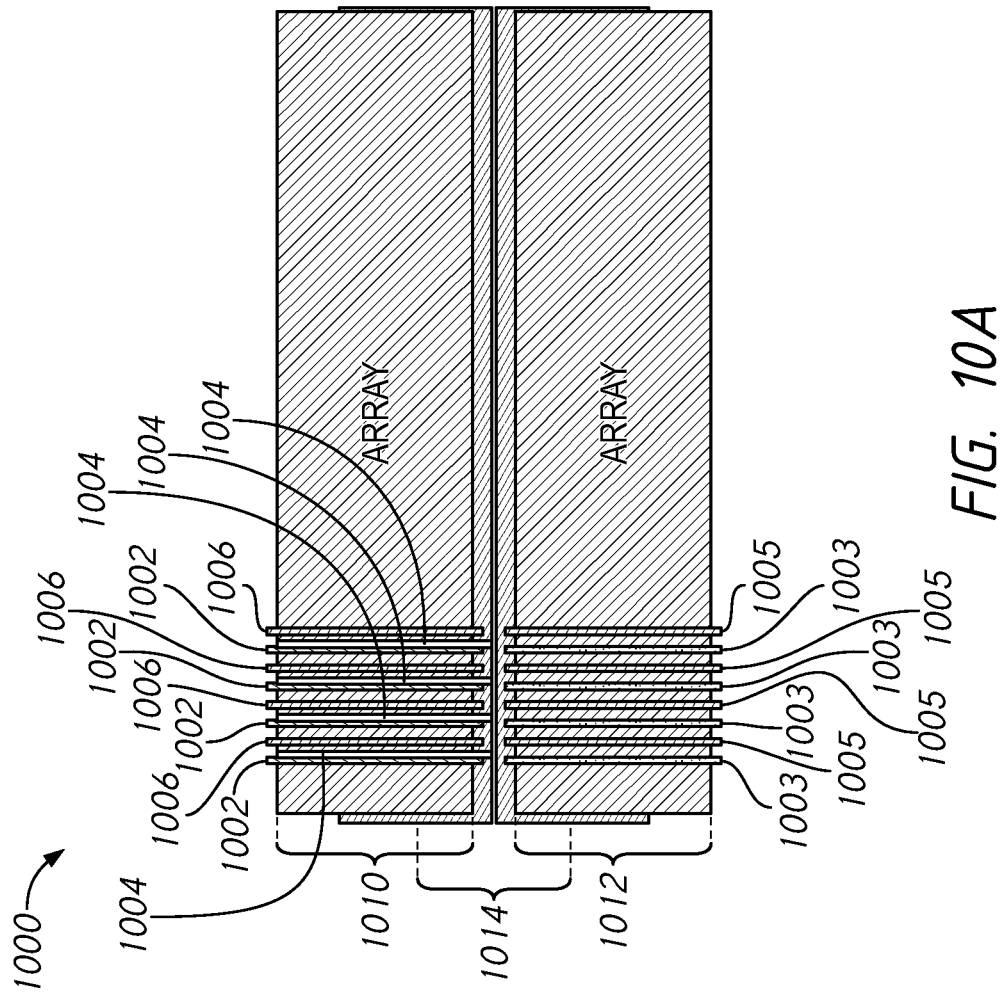
FIG. 10B
FIG. 10A

APPARATUSES, SYSTEMS, AND METHODS FOR FERROELECTRIC MEMORY CELL OPERATIONS

BACKGROUND

This disclosure relates generally to semiconductor devices, such as semiconductor memory devices. The semiconductor memory device may include a number of memory cells which are used to store information. Memory cells may store a physical signal, such as a charge, which may be used to represent the stored information. For example the memory cell may store a binary bit as charge on a capacitive element, with a first level of charge representing a low logical level, and a second level of charge representing a high logical level.

Different types of memory cells may store the physical signal in different ways (e.g., by using different types of capacitive element). The different types of memory cells may have different read timing. Similarly, memory cells may be operated in different fashions (e.g., charged to different levels) which may affect the read timing of the memory cell.

BRIEF DESCRIPTION OF THE DRAWINGS

FIGS. 4A-4B are block diagrams of a memory array according to some embodiments of the present disclosure.

FIGS. 10A-10B are block diagrams of a memory array according to some embodiments of the present disclosure.

DETAILED DESCRIPTION

Figure 1:
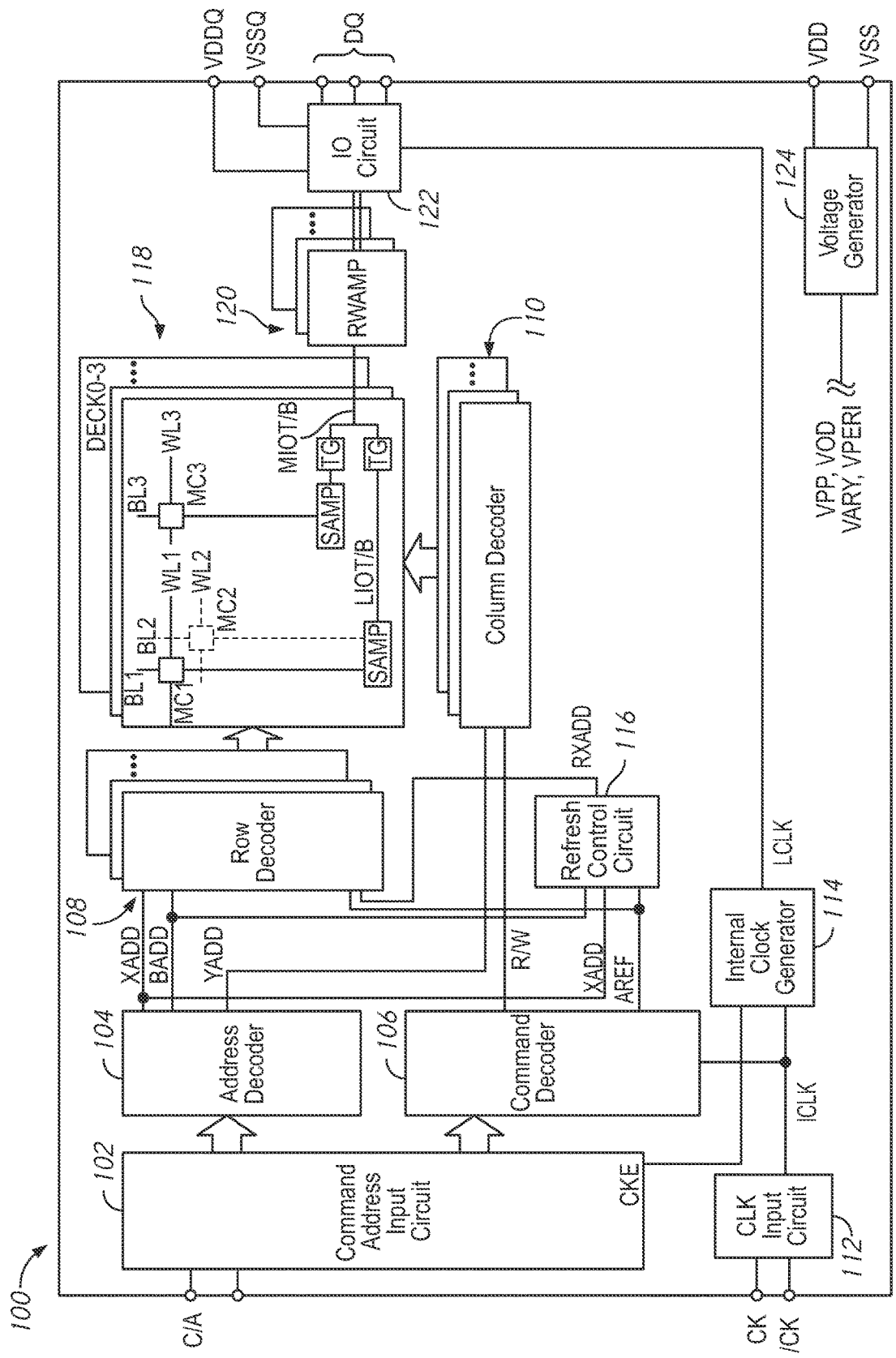
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). During a read or write operation, a row may be activated, and data may be read from, or written to, the memory cells along the activated row. Each memory cell stores information as a physical signal, such as charge. For example, ferroelectric memory (FeRAM) cells may use a ferroelectric material as part of a capacitive element, which may be charged as part of a write operation. During a write operation, voltage may be applied to the memory cell, which may build up charge on the memory cell. During a read operation, the charge may produce a voltage on a signal line (e.g., a digit line) coupled to the memory cell. After the charge in the memory cell changes the voltage on the digit line, the voltage on the digit line may then be compared to a reference to determine if the information stored in the memory cell was a high or low value.

The timing with which the memory cell charges a signal line may be based, in part, on the way in which the memory cell is operated. For example, reducing the amount of charge held in an FeRAM cell may decrease the time it takes for that charge to be read out of the FeRAM cell, however the reduced charge may also lead to relatively small changes in the voltage on the digit line, which may be difficult to accurately detect. It may be useful to have a memory array which includes a group of memory cells which can operated at high speed, while still producing a detectable signal.

The present disclosure is drawn to apparatuses, systems, and methods for a ferroelectric memory cell operations. A memory array includes a number of memory cells. Certain of these memory cells may be coupled together such that the charge on both memory cells contributes to a voltage signal provided to a sense amplifier. For example, a memory may have multiple stacked decks, and a memory cell on a first deck of the memory array may be coupled to a first digit line, while a memory cell on the second deck may be coupled to a second digit line. Both memory cells may store the same information, and both the first and the second digit lines may be coupled to the same sense amplifier, such that both memory cells contribute to the signal received by the sense amplifier. In some embodiments, both of the memory cells coupled to the same sense amplifier may hold the same logical value. In some embodiments, both of the memory cells coupled to the same sense amplifier may hold opposite logical values. The use of multiple memory cells coupled to the same digit line may increase the signal provided on the digit line, which may allow the memory cells to be operated in a manner which increases signal-to-noise ratio.

In some embodiments, additional modifications may be made to further improve the performance of the memory cells. For example, certain memory cells may be coupled to a ground voltage to act as shields. These shield memory cells may be positioned between adjacent memory cells which hold information (e.g., the memory may alternate shield and information holding memory cells). In some embodiments, physical changes may be made to the structure of certain memory cells. For example, a ferroelectric leaker layer may be used in some memory cells, and may be omitted for other memory cells, such as those in a region where multiple memory cells are coupled to the same digit line, the leaker may be omitted.

In some embodiments, the memory may have different groups of memory cells which are operated in different regions. For example, a first group of FeRAM memory cells may be operated in a 'full-range' region which is slower, but produces greater signal. Each of these memory cells may be coupled to digit lines which are coupled to individual sense amplifiers. A second group of FeRAM memory cells may be operated in a 'dielectric' region, where reduced charge differences during operation leads to increased speed but decreased signal. The second group of memory cells may be coupled to digit lines such that more than one digit line is coupled to each sense amplifier, and multiple memory cells hold the same information. In this manner, compared to the first region, the second region may have the same density of physical memory cells, but reduced density of stored information in exchange for increased access speed.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory decks, each of which includes one or more memory banks. In the embodiment of FIG. 1, four decks are shown, however more or fewer decks may be used in other embodiments. The decks may be stacked in a vertical direction (e.g., along an axis roughly normal to the plane of the chip). Each deck may have a number of memory banks, for example 2,4, or 8 memory banks. More or fewer banks per deck may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In some embodiments, certain components such as the command/address input circuit 102 may be on an interface die and shared by all the decks, while components such as the row decoder 108 may be deck specific and may be located on each deck. Similarly, some components such as the row decoder 108 may be bank specific and may be repeated for each bank on a given deck.

In the embodiment of FIG. 1, the row decoder 108 includes a respective row decoder for each memory bank and the column decoder 110 includes a respective column decoder for each memory bank. The bit lines BL1-BL3 are coupled to respective sense amplifier (SAMP). Read data from the bit lines BL1-3 is amplified by the sense amplifier SAMP, and transferred to read/write amplifiers 120 over complementary local data lines (LIOT/B), transfer gate (TG), and complementary main data lines (MIOT/B) which are coupled to a read/write amplifier RW AMP 120. Conversely, write data outputted from the RW AMP 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The memory array 118 may include memory cells which operate with a high speed operating characteristic. For example, if the memory cells are FeRAM cells, the high speed operating characteristic may involve operating the memory cells in a dielectric region, where the memory cells operate with increased speed, but reduced signal. The operating characteristics of memory cells are discussed in more detail in FIG. 3. Certain changes may be made to the memory array 118 in order to boost the signal from the memory cells operating with the high speed characteristic.

For example, the memory array 118 shows a first memory cell MC1 which is coupled at the intersection of a first word line WL1 and a first bit line BL1. The memory array 118 also includes a memory cell MC3 at the intersection of word line WL3 and bit line BL3. The memory cell MC1 may be operated with a fast operating characteristic (e.g., in a dielectric region) while the memory cell MC3 may be operated with a slower but high signal operating characteristic. In order to increase the signal from the memory cell MC1, the memory cell MC1 may be coupled to the same sense amplifier as memory cell MC2, which is used to store the same information as memory cell MC1. The memory cell MC2 is at the intersection of word line WL2 and bit line BL2, which may all be in a different deck of the memory than the memory cells MC1 and MC3 (and their respective word and bit lines). The bit lines BL1 and BL2 may both be coupled to the same sense amplifier. When information is written to the memory cell MC1, it may also be written to the memory cell MC2. When information is read out from the memory cell MC1, it may also be read out from MC2.

Since the two memory cells MC1 and MC3 are linked together, the memory device 100 may activate both memory cells responsive to a single control signal. For example, the row decoder 108 may provide a row command signal which activates both the word line WL1 and the word line WL2 while a different command signal activates the word line WL3. The column decoder 110 may provide a column command signal which activates both the bit lines BL1 and BL2, while a different command signal may activate the bit line BL3.

The memory array 118 may include different regions. A first region may include memory cells (e.g., MC1 and MC2) which operate with a first characteristic, and where multiple memory cells hold the same information and their respective digit lines are coupled to the same sense amplifier. A second region may include memory cells (e.g., MC3) which operate with a second characteristic and where memory cells may hold separate information and may be couple to digit lines which are couple to respective sense amplifiers. In some embodiments, each deck may include a first region and a second region. In some embodiments, some decks may include only a first region, while other decks include only a second region. Similarly, other embodiments may divide regions on a bank-by-bank basis.

The different regions of the memory array 118 may be coupled to different signals and drivers to accommodate the different operations. For example, digit lines of the first region may be charged to a first reference voltage as part of the read operation, while the digit lines of the second region may be charged to a second reference voltage as part of the read operation. Accordingly, there may be differences between the digit line drivers of the first and second regions. Similarly, different clock signals may be used to track access operations in the first or second region, since the different regions may be accessed with different speeds. In some embodiments, the memory cells of the first region may be organized into a cache of the memory device 100.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the ECC control circuit 120. The read command may also cause one or more parity bits associated with the read data to be provided along the MIOT/B to the RW AMP 120. The read/write amplifiers 120 may provide amplified data bits to the I/O circuit 122, which may provide the read data outside the device 100 from the data terminals DQ.

The device 100 may receive an access command which is a write command. When the write command is received, and a bank address, a row address and a column address are timely supplied with the write command, and write data is supplied through the DQ terminals to the read/write amplifier 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifier 120. The RW AMP 120 may alter the write data (e.g., by the changing the voltages) and may provide the write data to the memory array 118 to be written into the memory cells MC.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
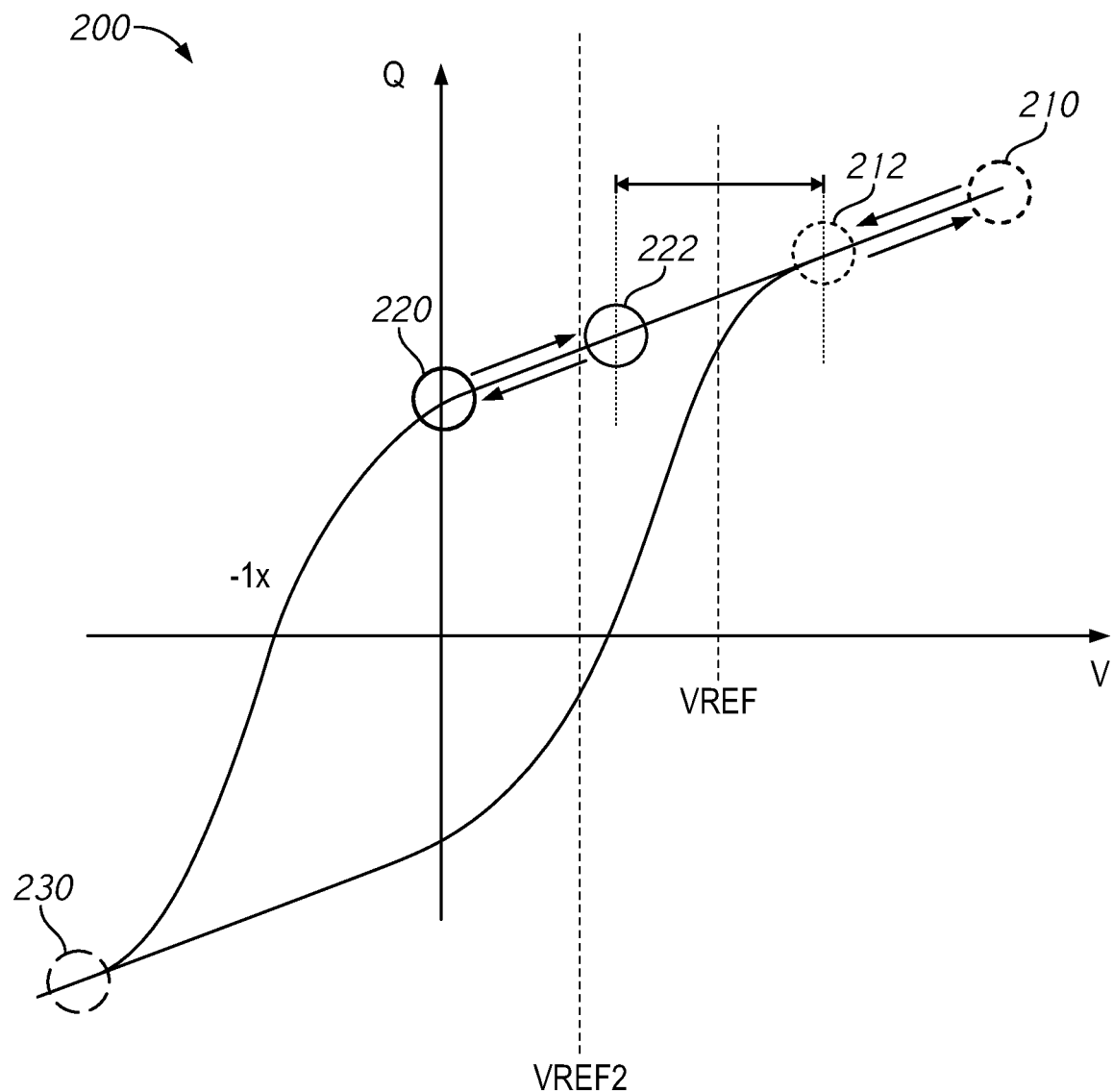
FIG. 2 is a graph of an example operation of a ferroelectric memory cell according to some embodiments of the present disclosure.

FIG. 2 is a graph of an example operation of a ferroelectric memory cell according to some embodiments of the present disclosure. The graph 200 shows an example of voltage (V) versus charge (Q) in an example memory cell, which may, in some embodiments, be used as one of the memory cells MC of FIG. 1. The graph 200 illustrates how varying the voltages applied to the memory cell may allow for different operation characteristics of the memory cell.

The graph 200 shows a solid line which represents the relationship between charge and voltage in the memory cell. As may be seen, the memory cell may have a hysteresis characteristic. Operational points 210, 220, and 230 have been marked as reference points to demonstrate how the memory cell may be operated.

In an example operation, the memory cell may be driven between a first operational point 210 and a second operational point 220. The first operational point 210 and the second operational point 230 may each represent a particular charge which may be held by the memory cell when a particular voltage is written to the memory cell. The operational points 210 and 220 may also represent the amount of voltage which is applied to a memory line when the charge in the memory cell is coupled to digit line.

The operational points 210 and 220 may represent different logical values which may be loaded in the memory cell. For example, the first operational point 210 may represent an amount of charge on the memory cell when it stores a low logical value (e.g., a '0'), while the second operational point 220 may represent an amount of charge on the memory cell when it stores a high logical value (e.g., a '1'). During an example write operation, the memory cell may be coupled to the digit line, and an amount of voltage may be applied to the digit line to charge the memory cell to either the first or the second operational point 210 or 220 depending on which logical value is being written to the memory cell.

During an example read operation, the digit line may be charged to a reference voltage VREF. The voltage VREF may, in some embodiments, be halfway between a voltage which represents a low logical value and a voltage which represents a high logical value (e.g., halfway between the voltage of point 210 and point 220). Other reference voltages may be chosen in other embodiments. After being charged to VREF, the digit line may then be coupled to the memory cell. The charge in the memory cell may then begin changing the voltage of the digit line. For example, if the memory cell stored a logical low value (e.g., operational point 210), then the charge in the memory cell may begin increasing the voltage on the digit line. When the digit line reaches a voltage represented by circuit 212, a sense amplifier coupled to the digit line may be triggered to determine that the digit line has an increased voltage, and that the stored value of the memory cell was a low logical level. In a similar fashion, if the memory cell held a high logical level then when coupled to the digit line it may begin decreasing the voltage of the digit line from VREF towards the voltage represented by operational point 220. Once the voltage on the digit line reaches the voltage represented by point 222, the sense amplifier may be triggered to detect that the memory cell held a high logical value.

Accordingly, the operational points 210 and 220 may represent extremes of a charge range (and/or voltage range) across which the memory cell is operated. The charge range represented by points 210 to 220 may represent operating the memory cell in a 'dielectric' region, where the memory cell exhibits relatively linear behavior. Since operating in the dielectric region (e.g., across the charge range between points 210 and 220) may require a relatively small change from VREF on the digit line, the values stored in the memory cell may be read out relatively quickly.

Other memory cells with the operational characteristics represented by graph 200 may also be operated in other regions of the hysteresis curve. These memory cells may operate across a charge range which is different from the charge range between points 210 and 220. For example, the memory cell may be charged to a charge represented by operational point 210 to represent a logical low, and may be charged to a charge represented by operational point 230 to represent a logical high. This charge range (e.g., 210 to 230) may be larger than the charge range in the dielectric region (e.g., between 210 and 220). The larger charge range may operate in regions of the memory cell's response which are non-linear, but may also allow for greater voltages to be applied to the digit line during read operations, which may improve signal. Although FIG. 2 shows the two charge ranges overlapping (e.g., both ranges use point 210) in some embodiments, the two charge ranges may not overlap. In some embodiments, the two charge ranges may overlap, but may not share a particular voltage/charge point.

A memory cell operated in the charge range between points 210 and 230 may use a different reference voltage VREF2 during read operations. In some embodiments the second reference voltage may be halfway between the voltages represented by points 210 and 230. As may be seen, when the memory cell is operated in such a fashion (e.g., a full-range), there is a much larger difference between the voltages and charges which represent a logical high and logical low. While this may make it easier for the sense amplifier to detect differences between the logical high and low, it may also reduce the speed of the read-out compared to operation in the dielectric region (e.g., between 210 and 220), since a larger voltage change is applied to the digit lines. In the dielectric region, the change on the voltage of the digit line during a read operation may be relatively small, which may happen relatively quickly compared to operation in the full-range of the graph 200.

In some embodiments, a memory may include memory cells which operate both in the dielectric region (e.g., between operational points 210 and 220) and also in the full-range region. The memory cells operated in the dielectric region may be operated faster than the memory cells in the full-range region, however each memory cell operated in the dielectric region may provide a smaller signal (e.g., change in voltage) to the coupled digit line. Various methods may be used to improve the operation of memory cells which are operated in the dielectric region.

Figure 3:
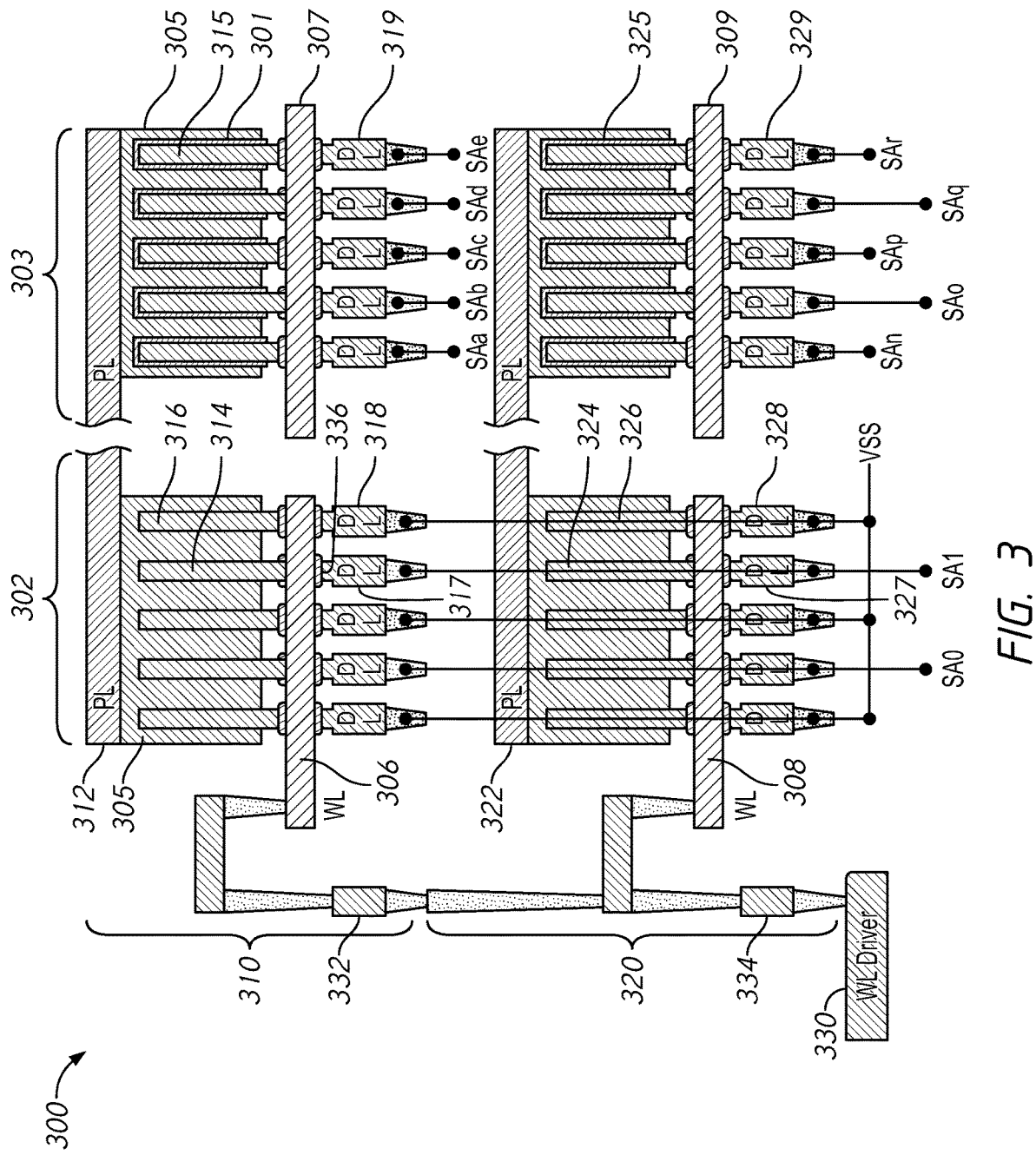
FIG. 3 is a cross-sectional diagram of a memory array according to some embodiments of the present disclosure.

FIG. 3 is a cross-sectional diagram of a memory array according to some embodiments of the present disclosure. The memory array 300 may, in some embodiments, be included in the memory array 118 of FIG. 1. The memory array 300 shows a first set 302 of memory cells 304 which may be operated in a dielectric region (e.g., in a first charge range such as between operational points 210 and 220 of FIG. 2) and a second set 303 of memory cells 305 which may be operated in a full-range manner (e.g., in a second charge range such as between points 210 and 230 of FIG. 2).

The memory array 300 may include a number of FeRAM memory cells such as 314-316 and 324-326. The memory array has a first set 302 of memory cells including memory cells 314, 316, 324, and 326, and a second set 303 of memory cells including memory cells 315 and 325. The memory array 300 is a 3D memory array, with memory cells arranged at the intersection of rows and columns, and also stacked in multiple decks. FIG. 3 shows a first word line 306 and a second word line 307 in a first deck 310, and a third word line 308 and fourth word line 309 in a second deck 320. Each word line is coupled to a number of memory cells. For example, word line 306 is coupled to memory cells 314 and 316 in a first region 302 of the memory 300. The word line 308 is coupled to memory cells 324 and 326 which are also in the first region 302 of the memory 300. The word line 307 is coupled to memory cell 315 and the word line 309 is coupled to memory cell 325, both of which are in a second region 303 of the memory. Each memory cell is coupled to a digit line.

Each memory cell includes a conductive element which is disposed in a substrate material 305. The substrate material 305 is coupled to a plate such as plate 312 for the first deck 310 and plate 322 for the second deck 322. During a read operation, the plate may be charged to voltage (e.g., a voltage which represents a logical high or logical low). For some memory cells, an insulative material such as a 'leaker' 301 may be disposed between the memory cell and the substrate 305. For example, memory cell 315 is shown surrounded by leaker 301. In some embodiments, the leaker material 301 may be omitted from memory cells which operate in the first region 302. The leaker material 301 may not be necessary since the memory cells of the first region 302 are operated in a dielectric region of the memory cell's operation (e.g., between points 210 and 220 of FIG. 2).

FIG. 3 shows two example decks 310 and 320, each of which shows a cross slice along word lines 306 and 308, respectively. The digit lines are shown running in and out of the cross-section (e.g., normal to the page of the drawing). In some embodiments, the memory cells, wordlines, and digit lines of a deck (e.g., 310) may be aligned in a vertical direction with the memory ells, word lines and digit lines of an adjacent deck (e.g., 320). For example, the memory cell 314 in the first deck 310 may be directly above memory cell 326 in the second deck.

The word lines are coupled to a word line driver 330. When a row is activated (e.g., as part of an access command) switches 332 and 334 may be activated in order to couple the activated word line to the word line driver 330, which may apply a voltage to the activated word line. The switches 332 and 334 may be activated based on signals generated in response to a row address (e.g., signals provided by row decoder 108 of FIG. 1) in order to couple the selected word line(s) to the word line driver 330. Switches and connections to the word line driver are omitted for the word lines 307 and 309 for clarity, however it should be understood that these word lines would also be word line driver 330. While FIG. 3 shows only a single word line driver 330, in some embodiments, there may be multiple word line drivers, each of which may handle one or more word lines.

Each memory cell is coupled to a digit line through a switch. In a manner similar to the word lines, when a memory cell is activated as part of an access operation, switches, such as switch 336 may be activated to couple the memory cells to the digit line. For example if a column address indicates a column including memory cell 314, then switch 336 may be activated to couple the memory cell 314 to the digit line 317 (e.g., responsive to signals from column decoder 110 of FIG. 1). As part of a read operation, the digit lines may be charged to a reference voltage by a digit line driver (not shown). In some embodiments, the digit line driver may charge a first set of digit lines (e.g., 317) in the first region 302 to a first reference voltage (e.g., VREF of FIG. 1), and a second set of digit lines (e.g., 319) in a second region 303 to a second reference voltage (e.g., VREF2 of FIG. 2). In some embodiments, the digit lines of the first region 302 may be coupled to a first digit line driver, while the digit lines of the second region 303 may be coupled to a second digit line driver.

In some embodiments, certain word lines (e.g., 306 and 308) of the memory may be coupled to memory cells (e.g., 314) which operate in a first region, while other word lines (e.g., 307 and 309) are coupled to memory cells (e.g., 315) which operate in a different region. In some embodiments, a row address may distinguish between different operational regions 302 and 303. In some embodiments, certain decks (e.g., 310 and 320) may be set aside for one type of memory operation (e.g., 302) while other decks (not shown) are set aside for other types of memory operation. In some embodiments, a word line may include memory cells which operate in both regions, and a column address may distinguish between the two operational regions 302 and 303.

The example memory array 300 shows examples of structural changes which may be made between the first set 302 and second set 303 of memory cells. These structural changes may be useful to improve the operation of the first set 302 of memory cells. For example, by decreasing signal-to-noise ratio (SNR) in the first set 302 of memory cells. In particular, the first set 302 shows multiple memory cells (e.g., 314 and 324) between different decks 310 and 320 of the memory array 300 coupled to the same sense amplifier and other memory cells (e.g., 316 and 326) used as shields. FIG. 3 shows both multiple memory cells tied to the same sense amplifier and shields, however it should be understood that other embodiments may use either separately. For example, some embodiments may use some memory cells as shields, but not have multiple memory cells simultaneously coupled to the same sense amplifier.

Memory cells 314 and 324 are coupled to digit lines 317 and 327 respectively, which are in turn coupled to the same sense amplifier (e.g., SA1). In some embodiments, the two memory cells 314 and 324 may effectively act as a single memory cell, and may both store the same information. In an example access operation, both word lines 306 and 308 and digit lines 317 and 327 may be activated, and the same information may be written to both memory cells 314 and 324. Although only two memory cells 314 and 324 are shown coupled together, more memory cells may be coupled together in other embodiments. In contrast, in the second section 303, each memory cell (e.g., 315 and 325) may store information independent of the information stored in other memory cells. In some embodiments, the digit lines of the second section 303 may each couple to a different sense amplifier.

Some of the memory cells of the first section 302 may be used as shielding to improve the signal to noise ratio of memory cells which are used to store information. For example, memory cells 314 stores a piece of information. The adjacent memory cells, such as memory cell 316 is used as a shield. The memory cells which are used as shields may be coupled (via their respective digit lines) in common to a system voltage, such as a ground voltage VSS. In some embodiments, going along a word line in the first section 302, the memory array 300 may alternate between memory cells which are used to store information, and memory cells which are used as shields.

FIGS. 4A-4B are block diagrams of a memory array according to some embodiments of the present disclosure. The memory array 400 shows a view of a memory similar to the memory array 300 of FIG. 3. For the sake of brevity, details, structures, and operations already described with regard to FIG. 3 will not be repeated.

The memory array 400 of FIG. 4A shows a 'top down' view of a memory array, where digit lines (e.g., 402-405) and word lines (not shown) run in the plane of the diagram, while decks (e.g., decks 310 and 320) would be stacked along an axis running in and out of the plane of the diagram. The memory array 400 is divided into a first area 410 and a second area 412. The first and second area are separated by a region 414 which contains the sense amplifiers.

The memory array 400 shows example digit lines 402 and 404 in the first area 410 and digit lines 403 and 405 in the second area 412. The first area 410 shows alternating digit lines 402 and 404. The digit lines 402 are coupled to the same sense amplifier as another digit line in a different deck. The digit lines 404 are coupled to a ground voltage (e.g., VSS) and act as shields. Going along the first area 410, the digit lines may alternate between digit lines 402 which are coupled to together with an adjacent deck, and digit lines 404 which act as shields. In a similar fashion, the second area 412 may alternate between digit lines 403 coupled to the same sense amplifier as a digit line on an adjacent deck, and digit lines 404 coupled to a ground voltage to act as a shield.

Inset 420 of FIG. 4B shows the connection of digit lines 422-425 to a sense amplifier 428 in more detail. The digit lines 422 and 423 are on a first and second deck of the memory 400. They are shown slightly offset from each other for clarity, however in some embodiments they may be vertically aligned. The two digit lines 422 and 423 are each located in a respective first area 410 of their decks (e.g., both digit lines 422 and 423 are one of the digit lines 402 in that deck). Similarly the digit lines 424 and 425 may represent digit lines in different decks which are both coupled to the same sense amplifier 428.

The two digit lines 422 and 423 may intersect word lines which may both be coupled to the same word line driver (e.g., 330 of FIG. 3) and may be activated by the same signal WL from the row decoder (e.g., 108 of FIG. 1). The two digit lines 424 and 425 intersect a word line which is controlled by a different signal from the row decoder, and activated separately from the word line which intersects digit lines 422 and 423. The digit lines 422 and 423 may be coupled to a first input (e.g., Input+) of the sense amplifier 428, while the digit lines 424 and 425 are coupled to a second input (e.g., Input−) of the sense amplifier 428.

During an example write operation, the word line signal WL may activate word lines which intersect digit lines 422 and 423. The digit lines 422 and 423 may also both be activated, and a value (e.g., a logical high or a logical low) may be written to the memory cells at the intersection of the activated word line and digit line 422 and 423. Accordingly, the same information, and same logical value, may be written to two different memory cells.

During an example read operation, both digit lines 422 and 423 may be activated, and the signal WL may activate the word lines which intersect them. The word lines which intersect digit lines 424 and 425 may remain inactive. The digit lines 422, 423, 424, and 425 may all be charged to a reference voltage as part of the read operation. Both digit lines 422 and 423 may contribute a signal (e.g., by changing the digit line from a reference voltage) which may be detected by the sense amplifier 428. The digit lines 424 and 425 may contribute the reference voltage to the sense amplifier, which may determine the value stored in the memory cell in part based on the difference between the signals from the digit lines 422 and 423 and the digit lines 424 and 425. A different read operation may activate a word line which intersects the digit lines 424 and 425, but not a word line which intersects the digit lines 422 and 423. Other methods of coupling digit lines to the sense amplifier are discussed in FIGS. 7 and 9.

Figure 5:
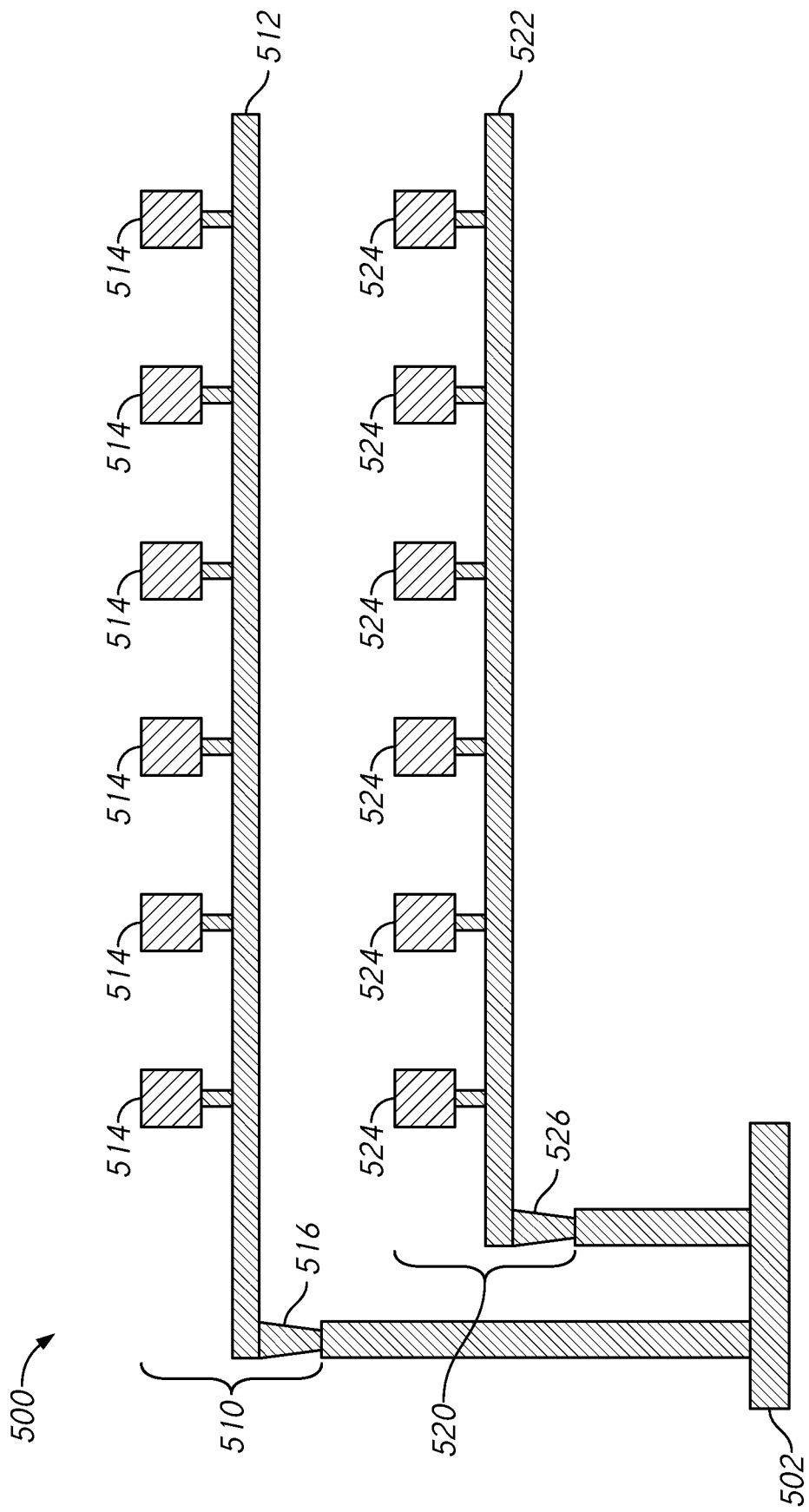
FIG. 5 is a cross sectional diagram of a memory array according to some embodiments of the present disclosure.

FIG. 5 is a cross sectional diagram of a memory array according to some embodiments of the present disclosure. The memory array 500 of FIG. 5 is similar to the memory array 300 of FIG. 3, except that the memory array 500 shows a cross section along a digit line (rather than along the word lines as in FIG. 3). The memory array 500 highlights how different digit lines in the first region (e.g., 302 of FIG. 3) may be coupled together.

The memory array includes a first deck 510 and a second deck 520. The first deck includes a digit line 512 which is coupled to a number of word lines 514 (and through them to a number of memory cells). The digit line may end in a socket 516, which may be coupled down to a metal layer 502. In a similar fashion, the memory array 500 includes a second deck 520 which has a digit line 522 coupled to word lines 524 and coupled through a socket 526 to the same metal layer 502. The metal layer 502 may be used to short the two digit lines 512 and 522 together through their sockets. The digit lines 512 and 522 may be coupled to a single sense amplifier. For example, the sense amplifier may be coupled to one of the two digit lines 512 or 522 or may be coupled to the metal layer 502. In this manner when word line 5514 and 524 in each deck 510 and 520 is activated, the memory cells coupled to the digit lines 512 and 522 are both read out to the same sense amplifier.

Figure 6:
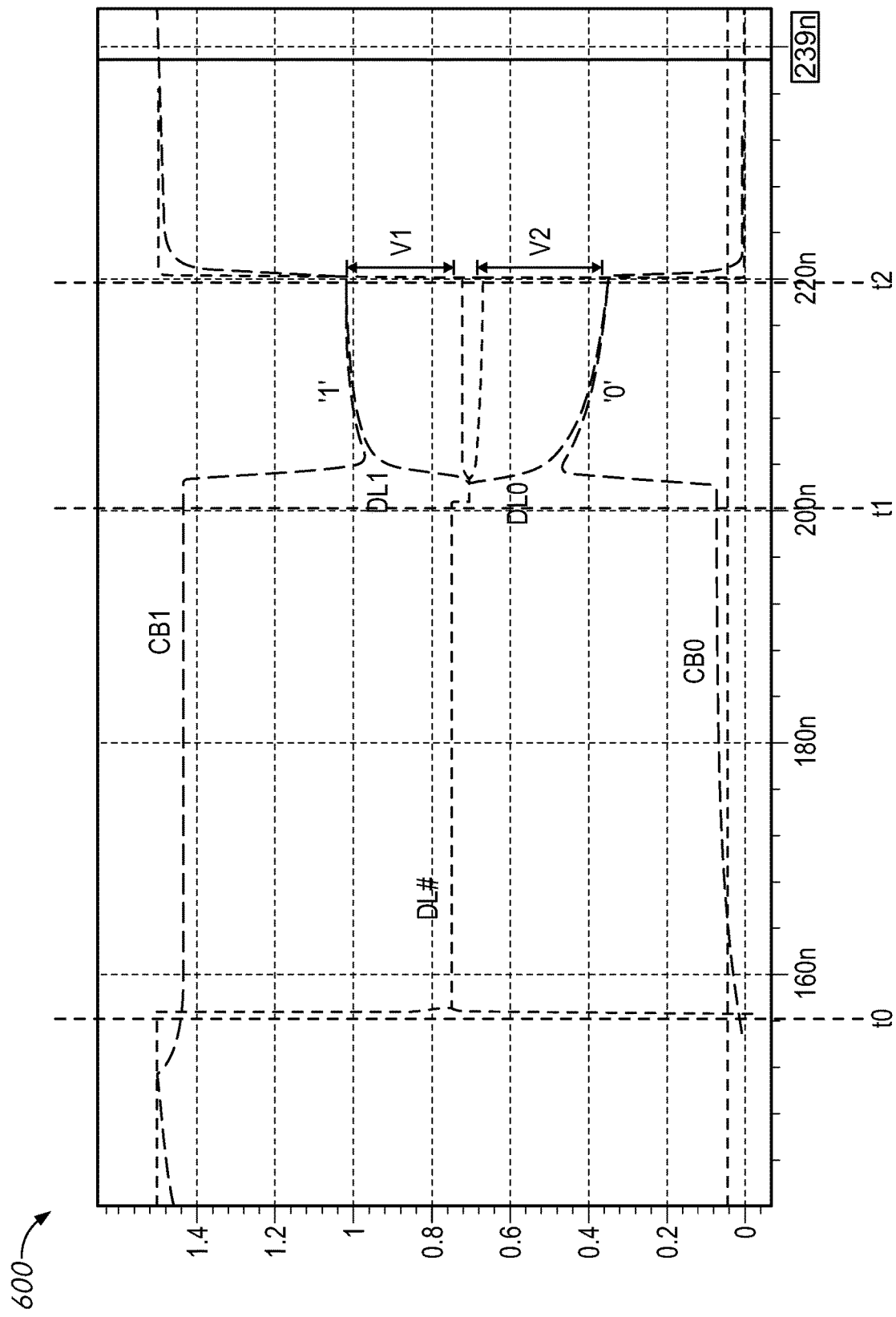
FIG. 6 is a graph of an example operation of memory cells according to some embodiments of the present disclosure.

FIG. 6 is a graph of an example operation of memory cells according to some embodiments of the present disclosure. The graph 600 may represent the operation of example memory cells which are both coupled to the same sense amplifier as part of a read operation (e.g., memory cells such as those in the first region 302 of FIG. 3, memory cells of the memory array 400 of FIGS. 4A-4B, and/or the memory array 500 of FIG. 5). The graph 600 shows voltage (vertical axis) versus time (horizontal axis). While example numerical values are listed for these axes, it should be understood that these are examples only, and that different voltages and times may be used in other embodiments.

The graph 600 shows an example operation for two different digit lines (each of which is coupled to multiple memory cells, for example in different decks). An example digit line DL1 is coupled to memory cells which store a logical high value (e.g., a '1'). An example digit line DL0 is coupled to memory cells which store a logical low value (e.g., a '0'). For example, the digit line DL1 may be coupled to a memory cell (e.g., along an activated word line) which stores a high logical level, and also coupled to a different digit line (e.g., in a different deck) which is also coupled to a memory cell (e.g., along a different activated word line) which also stores a high logical level. Since the two digit lines are shorted together, the voltage of only one of them (e.g., DL1) is shown in the graph 600. The voltage of DL1 may reflect a contribution from both memory cells.

The trace DL # may represent the voltage of digit lines which are on the opposite side of the memory array from the activated digit lines DL1 and DL0. For example, in FIG. 6, the DL0 may represent a contribution from digit lines such as 422 and 423 of FIG. 4 which are on a first side 410 of the array 400, while the signal DL # represent the contribution from digit lines such as 424 and 425 which are on an opposite side 412 of the memory array 400.

Referring back to FIG. 6, the graph 600 also shows memory cells CB1 and CB0. The memory cell CB1 represents an example of the voltage in a memory cell which is storing a logical high value, while the memory cell CB0 represents the voltage in a memory cell storing a logical low value.

At an initial time t0, the digit lines, including DL0, DL1 and DL # are charged to a reference voltage. The reference voltage may be about halfway between a voltage which represents a logical high and a voltage that represents a logical low. A memory cell CB1 stores a voltage level which represents a logical high. A memory cell CB0 stores a voltage level which represents a logical low. At a first time t1, as part of a read operation, the memory cell CB0 is coupled to the digit line DL0, and the memory cell CB1 is coupled to the digit line DL1. The digit lines DL # are not coupled to any memory cells (since their word lines are not activated as part of this operation). This causes the voltage on the digit line DL1 to rise as the memory cell CB1 is discharged. This also causes the voltage on the digit line DL0 to decrease, as the memory cell CB0 is charged by the reference voltage. The digit lines DL # may experience a slight change in voltage (e.g., due to coupling or drift) but remain close to the value of the reference voltage.

At a second time t2, the sense amplifier may latch the value read out from the memory cells, which may drive the voltage of the digit lines to respective system voltages which represent high and low logical levels. The sense amplifier may determine if a given digit line represents a high or low value based on a difference between the two inputs of the sense amplifier. In the case of the digit line DL1, there is a voltage V1 between the voltage of the two inputs, represented by DL1 and DL #. In the case of the digit line DL0, there is a voltage V2 between the voltage of the two inputs, represented by DL # and DL0. In some embodiments, the voltages V1 and V2 may be about 250 mV and −250 mV respectively. Other voltages may be used in other example embodiments.

Figure 7B:
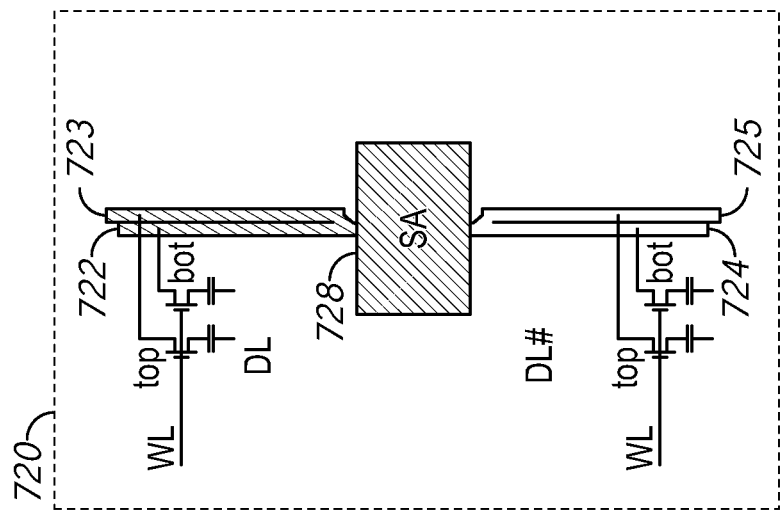
FIGS. 7A-7B are block diagrams of a memory array according to some embodiments of the present disclosure.
Figure 7A:
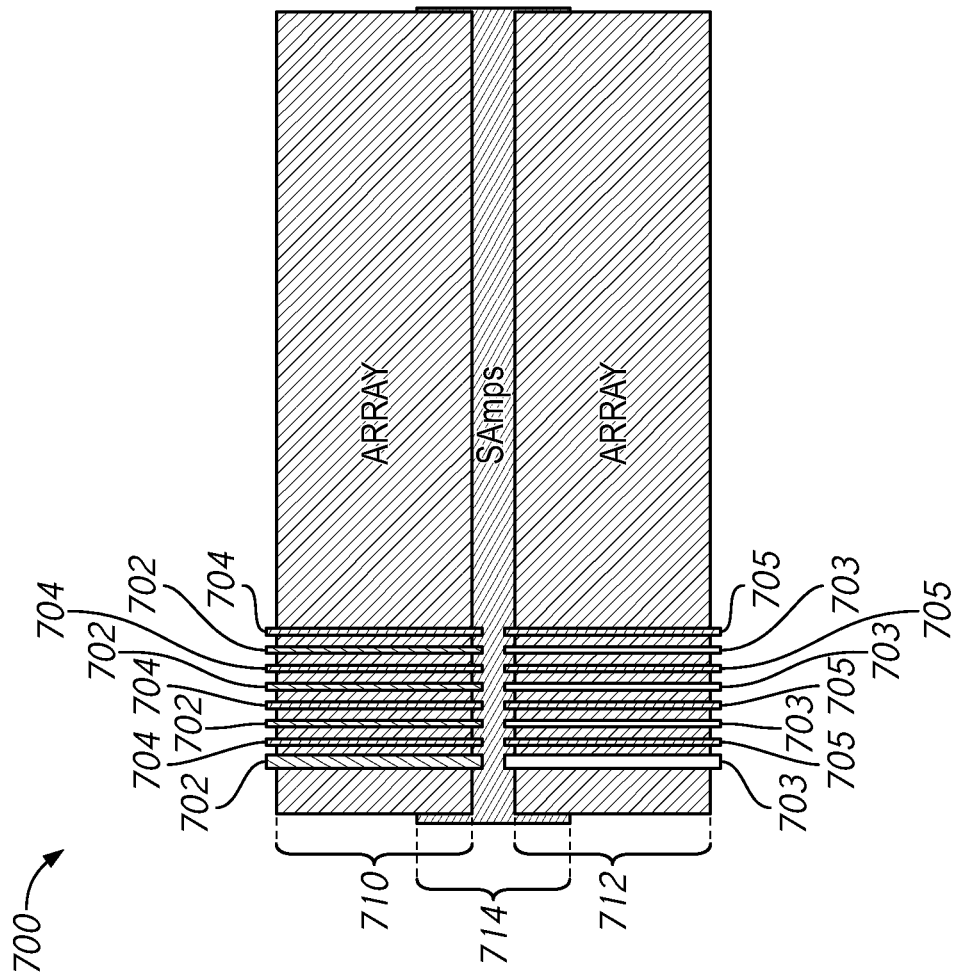

FIGS. 7A-7B are block diagrams of a memory array according to some embodiments of the present disclosure. The memory array 700 of FIG. 7A may generally be similar to the memory array 400 of FIG. 4A, except that in the memory array 700, word lines which intersect digit lines on both sides 710 and 712 of the array 700 are activated at the same time as part of a read operation. For the sake of brevity, features and operations similar to those already described with respect to FIGS. 4A-4B will not be repeated again with respect to FIG. 7.

In the memory array 700 a word line signal WL from the row decoder may activate word lines which intersect both digit lines such as 702 in the first side 710 and digit lines such as 703 in the second side 712. Considering inset 720 of FIG. 7B, the word line signal WL may activate wordlines which intersect digit lines 722 and 723 (which are in different decks from each other) and which intersect digit lines 724 and 725, which are in the same decks as digit lines 722 and 723 respectively, but on opposite sides of the array 700. Accordingly, during access operations, four memory cells may be activated.

Since the digit lines 722 and 723 and the digit lines 724 and 725 are coupled to differential inputs of the sense amplifier 728, although all four memory cells may hold the same information, the memory cells on the first side 710 may hold different a different value than the memory cells on the second side 712. For example, memory cells coupled to digit lines 722 and 723 may hold a 'true' value of the information, while the memory cells coupled to digit lines 724 and 725 may hold a complimentary value of the stored information. Accordingly, during an example read operation, the digit lines 722/723 and the digit lines 724/725 may move in opposite directions away from the reference voltage. This may allow for a greater voltage difference on the differential inputs of the sense amplifier 728.

Figure 8:
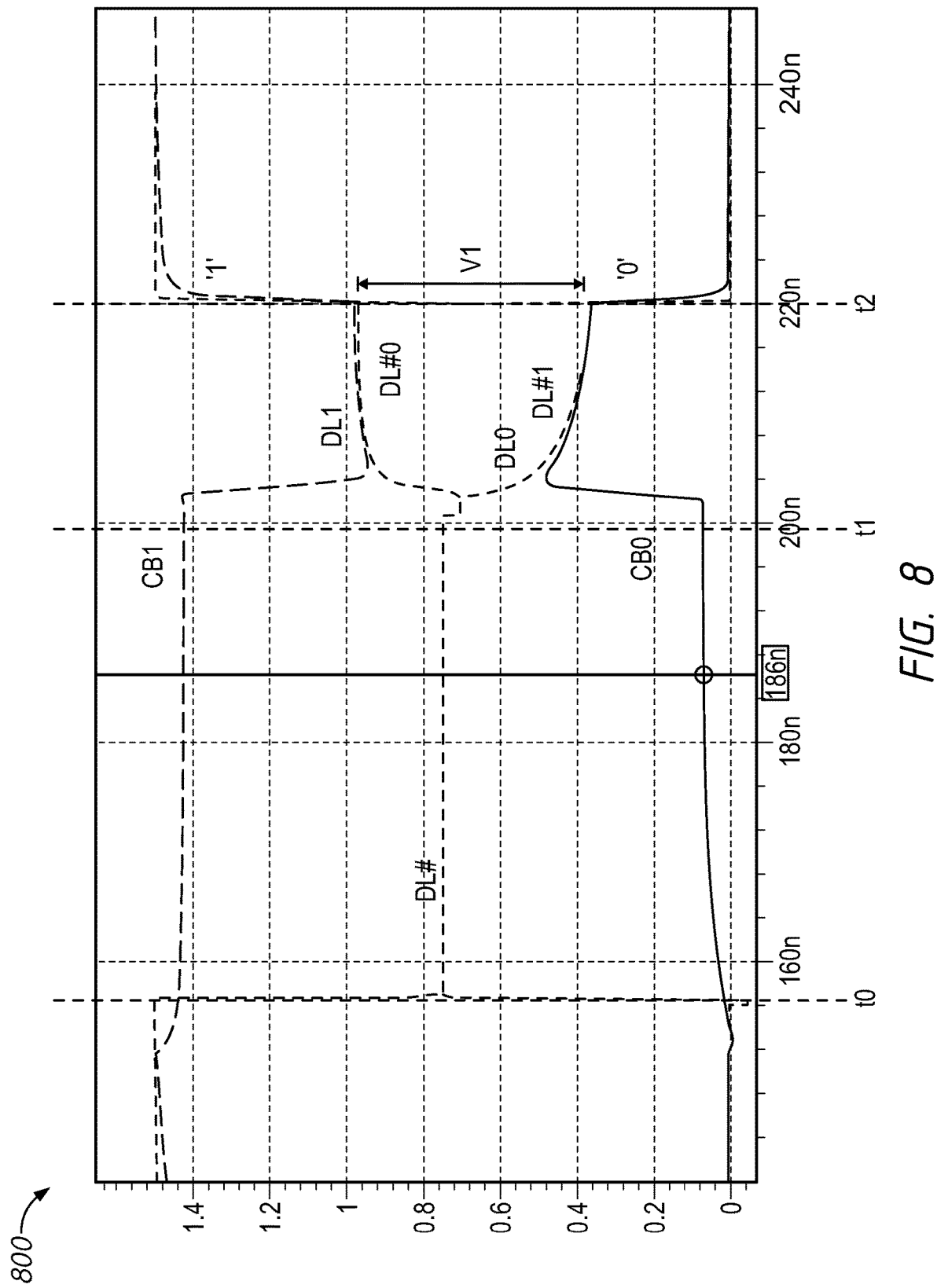
FIG. 8 is a graph of an example operation of memory cells according to some embodiments of the present disclosure.

FIG. 8 is a graph of an example operation of memory cells according to some embodiments of the present disclosure. The graph 800 may generally be similar to the graph 600 of FIG. 6, except that the graph 800 represents the operation of the memory array 700 of FIGS. 7A-7B, where memory cells in both sides (e.g., 710 and 712) may be activated as part of a read operation. For the sake of brevity, features and operations similar to those already described with respect to FIG. 6 will not be repeated again with respect to FIG. 8.

After being pre-charged to the reference voltage at initial time to, at the time t1, the memory cells are coupled to the digit lines. Accordingly, the digit line DL1 may be coupled to the memory cell CB1. At the same time, the digit line DL #1, which is on the opposite side of the memory array may be coupled to memory cells CB0 which hold a low logical level (e.g., complimentary to the 'true' logical high held in the memory cell CB1 coupled to DL1). Accordingly the voltage on DL1 may increase, while the voltage on DL #1 may decrease. In a similar fashion, the digit line DL0 may decrease in voltage at t1, while the digit line DL #0 may increase.

Accordingly at the time t2, when the sense amplifier latches the read value there may be a difference V1 between DL1 and DL #1 (and the same difference V1 between DL0 and DL #0). In some embodiments, the voltage V1 may be a bout 500 mV. Other voltages may be used in other example embodiments. Accordingly, the voltage difference on the inputs on the sense amplifier may be greater than in the scenarios outlined in FIG. 6.

Figure 9:
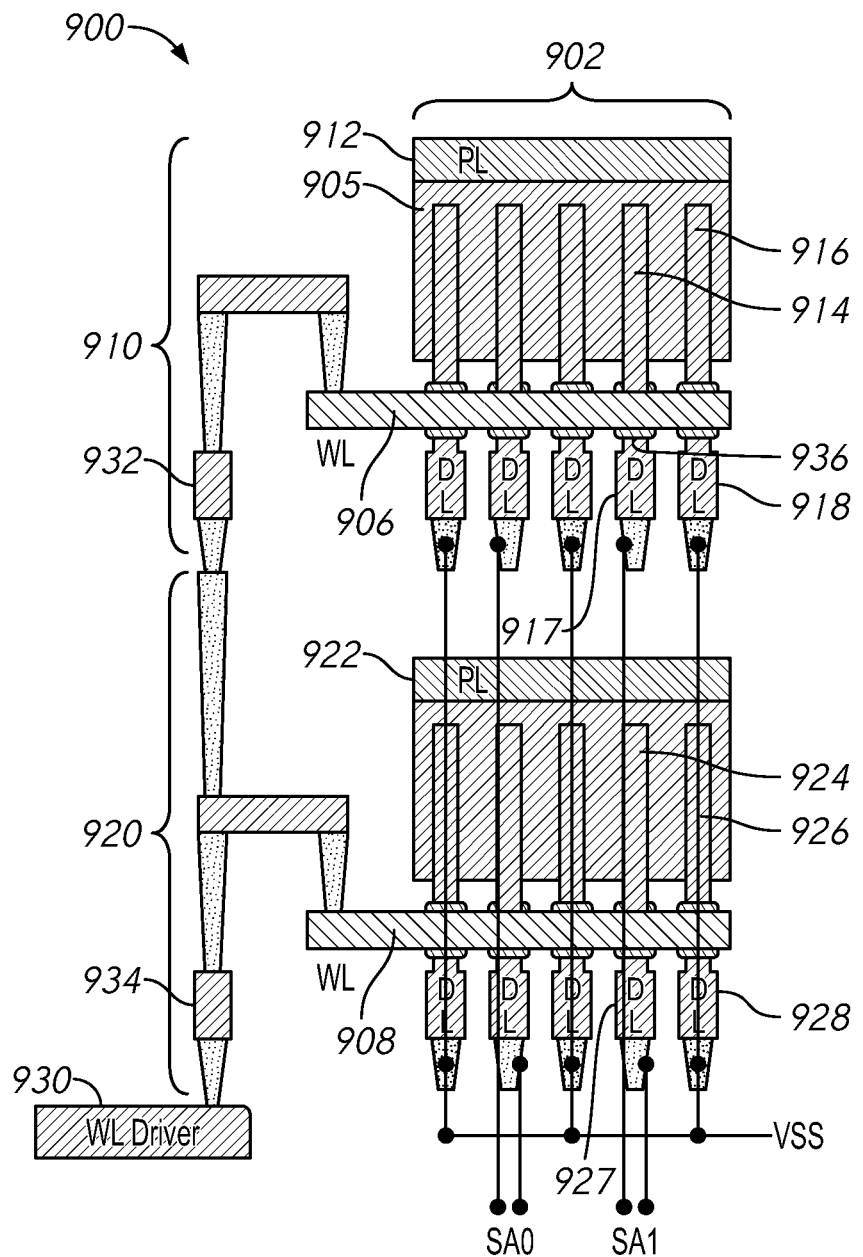
FIG. 9 is a cross-sectional diagram of a memory array according to some embodiments of the present disclosure.

FIG. 9 is a cross-sectional diagram of a memory array according to some embodiments of the present disclosure. The memory array 900 may generally be similar to the memory array 300 of FIG. 3, except that in the memory array 900, a digit line 917 in the first deck 910 is coupled to a first input of the sense simplifier, while the digit line 927 of the second deck 920 is coupled to a second input of the sense amplifier. This is in contrast to the memory array 300, where both digit lines are shorted together to the same input of the sense amplifier. For the sake of brevity, features and operations similar to those already described with respect to FIG. 3 will not be repeated again with respect to FIG. 9.

The memory array 900 of FIG. 9 shows a cross-section along a word line, in a first deck 910 and second deck 920, where the memory cells alternate between being used to store information, and being coupled to a ground voltage to act as a shield. Example memory cell 914 may be coupled through digit line 917 to a first input (e.g., Input+) of a sense amplifier SA1, while example memory cell 924 may be coupled through digit line 927 to a second input (e.g., Input−) of the same sense amplifier SA1. During a write operation, the memory cells 914 and 924 may store the same information, but as complimentary values. For example, if a high logical value is written to memory cell 914, then a low logical value may be written to memory cell 924.

FIGS. 10A-10B are block diagrams of a memory array according to some embodiments of the present disclosure. The memory array 1000 of FIG. 10A may be a 'top down' view of the memory array 900 of FIG. 9. The memory array 1000 may be generally similar to the memory array 700 of FIG. 7A, except that the memory array 1000 shows a memory array in which two digit lines on the same side of the array are coupled to different inputs of the same sense amplifier. For the sake of brevity, features and operations similar to those already described with respect to FIGS. 7A-7B will not be repeated again with respect to FIG. 10.

The memory array 1000 shows digit lines 1002 which may be in a first deck, and digit lines 1004 which may be in a second deck. Digit lines 1006 which act as shields, may be between adjacent digit lines 1002 and/or between adjacent digit lines 1004. The digit lines 1004 and 1006 may both be on the same side 1010 of the memory array 1000.

During an example read operation in the memory array 1000, a word line signal WL from the row decoder may activate a word line which intersects example digit line 1022, which may be one of the digit lines 1002, and a word line which intersects example digit line 1023, which may be one of the digit lines 1004. A column decoder may activate digit lines 1022 and 1023. A digit line driver may charge the digit lines 1022 and 1023 to a reference voltage in preparation for a read operation. Unlike in the memory arrays 400 of FIGS. 4A-4B and 700 of FIGS. 7A-7B, the digit lines 1003 of the second side 1012 may remain unselected, and may not be used as part of the read operation.

Figure 11:
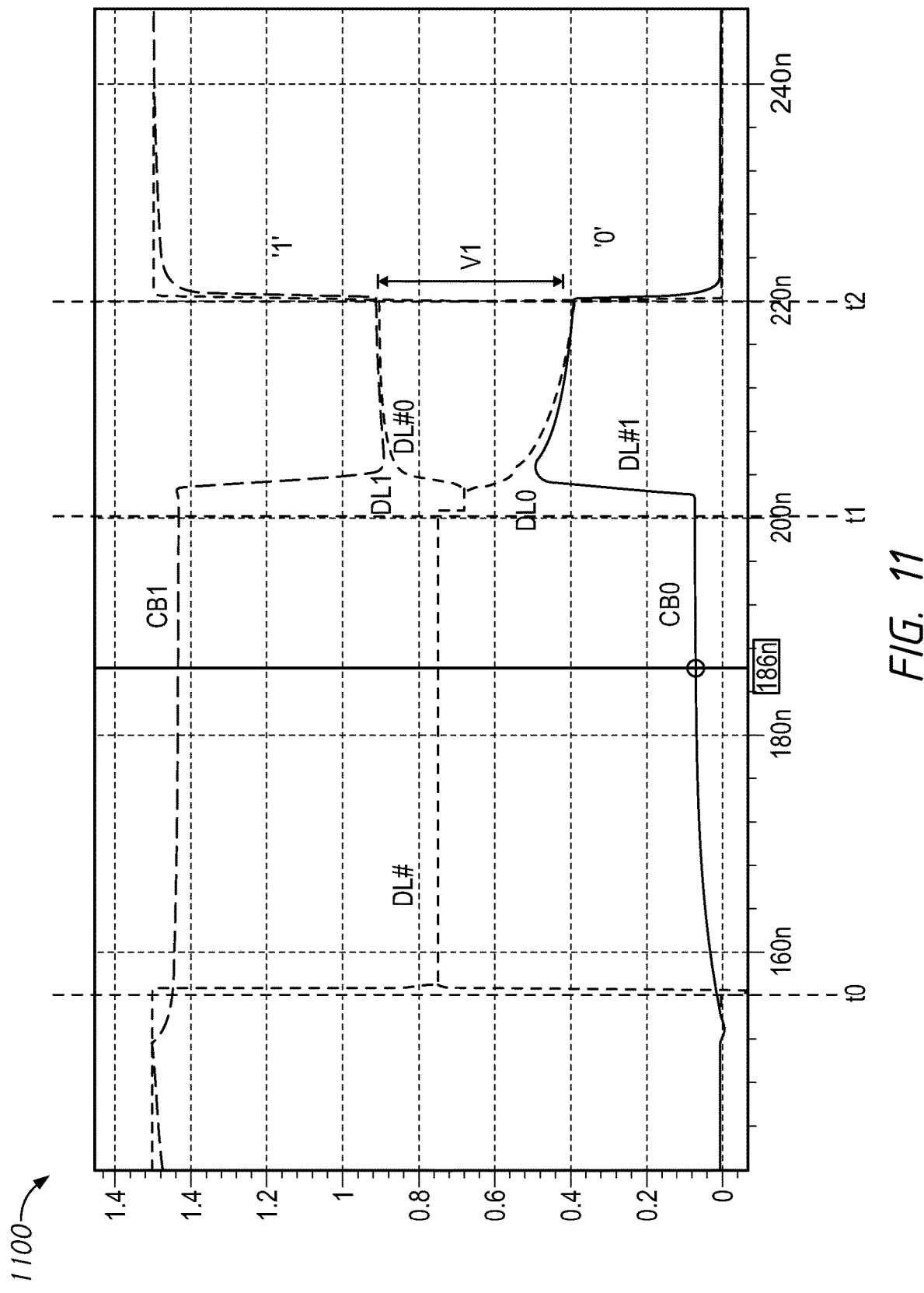
FIG. 11 is a graph of an example operation of memory cells according to some embodiments of the present disclosure.

FIG. 11 is a graph of an example operation of memory cells according to some embodiments of the present disclosure. The graph 1100 may generally be similar to the graph 600 of FIG. 6 and 800 of FIG. 8, except that the graph 1100 represents the operation of the memory array 900 of FIG. 9 and 1000 of FIGS. 10A-10B, where memory cells on a single side are coupled to different inputs of a single sense amplifier. For the sake of brevity, features and operations similar to those already described with respect to FIGS. 6 and 8 will not be repeated again with respect to FIG. 11.

After being pre-charged to the reference voltage at initial time t0, at the time t1, the memory cells are coupled to the digit lines. Accordingly, the digit line DL1 may be coupled to the memory cell CB1. At the same time, the digit line DL #1, which is on the same side of the memory array but on a different deck than the digit line DL1 may be coupled to memory cells CB0 which hold a low logical level (e.g., complimentary to the 'true' logical high held in the memory cell CB1 coupled to DL1). Accordingly the voltage on DL1 may increase, while the voltage on DL #1 may decrease. In a similar fashion, the digit line DL0 may decrease in voltage at t1, while the digit line DL0 may increase.

Accordingly at the time t2, when the sense amplifier latches the read value there may be a difference V1 between DL1 and DL #1 (and the same difference V1 between DL0 and DL #0). In some embodiments, the voltage V1 may be a bout 400 mV. Other voltages may be used in other example embodiments. Accordingly, the voltage difference on the inputs on the sense amplifier may be greater than in the scenarios outlined in FIG. 6, but may require the use of less memory cells than the scenarios outlined in FIGS. 7-8.

In at least one aspect, the present disclosure may relate to an apparatus including a first deck of a memory array, a second deck of the memory array, a first sense amplifier, and a second sense amplifier. The first deck includes a first memory cell and a second memory cell. The second deck includes a third memory cell. The second deck is stacked on the first deck. The first sense amplifier may receive information from the first memory cell and the third memory cell. The second sense amplifier may receive information from the second memory cell.

The apparatus may also include a first digit line coupled to the first memory cell, a second digit line coupled to the second memory cell, and a third digit line coupled to the third memory cell. The first sense amplifier may be coupled to the first and the third digit lines, and the second sense amplifier may be coupled to the second digit line. The first deck may also include a fourth digit line positioned adjacent to the first digit line, and the fourth digit line may be coupled to a ground voltage. The first digit line and the third digit line may be charged to a first reference voltage as part of a read operation, and the second digit line may be charged to a second reference voltage different than the first reference voltage as part of a read operation.

The first memory cell and the third memory cell may store the same information. The first memory cell and the third memory cell may operate over a first charge range, and the second memory cell may operate over a second charge range. The first, the second, and the third memory cells may be ferroelectric memory (FeRAM) cells. The first charge range may be a dielectric region of the FeRAM cells.

In at least one aspect, the present disclosure may relate to an apparatus including a first memory cell in a first deck of the memory, a second memory cell in a second deck of the memory, a sense amplifier, a first digit line coupled to the sense amplifier and to the first memory cell, and a second digit line coupled to the sense amplifier and to the second memory cell.

The apparatus may also include a third memory cell in the first deck of the memory, a second sense amplifier, and a third digit line coupled to the second sense amplifier and the third memory cell.

The apparatus may also include a third digit line positioned adjacent to the first digit line, a fourth digit line positioned adjacent to the second digit line. The third digit line and the fourth digit line may be coupled to a ground voltage.

The apparatus may include a metal layer. The first deck may be stacked on the metal layer and the second may be stacked on the first deck. A socket of the first digit line may be shorted to a socket of the second digit line through the metal layer. The first digit line and the second digit line may be coupled to a first input terminal of the sense amplifier, and the first memory cell and the second memory cell may be configured to store the same value. The first digit line may be coupled to a first input terminal of the sense amplifier and the second digit line may be coupled to a second input terminal of the sense amplifier, and the first memory cell and the second memory cell may store complimentary values. The apparatus may include a first word line coupled to the first memory cell and a second word line coupled to the second memory cell. The first word line and the second word line may be activated responsive to a control signal.

In at least one aspect, the present disclosure may relate to an apparatus including a first memory deck, a second memory deck stacked on the first memory deck, and a plurality of sense amplifiers. The first memory deck includes a plurality of memory cells arranged at the intersection of a plurality of first word lines and a plurality of first digit lines. The second memory deck includes a plurality of memory cells arranged at the intersection of second word lines and second digit lines. The plurality of sense amplifiers are each coupled to one of the plurality of first digit lines and one of the plurality of second digit lines.

The apparatus may also include a row decoder which provides a command signal which activates a selected one of the plurality of first word lines and a selected one of the plurality of second word lines. The first deck may also include a plurality of third digit lines, and each of the plurality of first digit lines may be adjacent to at least one of the plurality of third digit lines. The second deck may also include a plurality of fourth digit lines. Each of the plurality of second digit lines may be adjacent to at least one of the plurality of fourth digit lines. The plurality of third digit lines and the plurality of fourth digit lines may be coupled to a ground voltage.

The first deck further may include a plurality of third digit lines. Selected ones of the plurality of first word lines and selected ones the plurality of second digit lines may be charged to a first reference voltage as part of a read operation. Selected ones of the plurality of third digit lines may be charged to a second reference voltage different than the first reference voltage as part of a read operation.

Each of the plurality of sense amplifiers may include a first input terminal and a second input terminal. The first input terminal may be coupled to the associated one of the plurality of first digit lines and to the associated one of the plurality of second digit lines.

Each of the plurality of sense amplifiers may include a first input terminal and a second input terminal. The first input terminal may be coupled to the associated one of the plurality of first digit lines and the second input terminal may be coupled to the associated one of the plurality of second digit lines.

In at least one aspect, the present disclosure relates to an apparatus including a first memory deck and a second memory deck. The first memory deck includes a first region including a first digit line, a second region including a second digit line, and a sense amplifier region positioned between the first region and the second region, the sense amplifier region including a sense amplifier. The second memory deck is stacking on the first memory deck and includes a third region of a memory array including a third digit line and a fourth region of the memory array including a fourth digit line. The sense amplifier is coupled to the first digit line and the second digit line.

The first digit line and the third digit line may be coupled to a first input terminal of the sense amplifier and the second digit line and the fourth digit line may be coupled to a second input terminal of the sense amplifier. As part of a read operation, the first digit line and the second digit line may be coupled to respective memory cells, while the third digit line and the fourth digit line hold a reference voltage. As part of a read operation, the first digit line, the second digit line, the third digit line, and the fourth digit line may all be coupled to respective memory cells.

The first digit line may be coupled to a first input terminal of the sense amplifier, and the second digit line may be coupled to a second input terminal of the sense amplifier.

The apparatus may also include a first word line which intersects the first digit line, a second word line which intersects the second digit line, a third word line which intersects the third digit line, and a fourth word line which intersects the fourth digit line. As part of a read operation the first word line and the third word line may be activated by a first command signal. The third word line and the fourth word line may also be activated responsive to the first command signal.

In at least one aspect, the present disclosure may relate to an apparatus including a first memory cell region comprising a plurality of ferroelectric memory (FeRAM) cells operated across a first charge range of the plurality of memory cells and a second memory cell region comprising a plurality of FeRAM cells operated across a second charge range of the plurality of memory cells.

As part of a write operation, the same information may be written to more than one of the plurality of FeRAM cells of the first memory cell region. The first memory cell region may include a plurality of digit lines coupled to one of the plurality of FeRAM cells and a plurality of digit lines coupled to a ground voltage. Each of the plurality of digit lines coupled to the one of the plurality of FeRAM cells may be adjacent to one or more of the plurality of digit lines coupled to the ground voltage. The first charge range may be smaller than the second charge range.

In at least one aspect, the present disclosure may relate to an apparatus including a first memory cell region including a plurality of first memory cells, each of the plurality of first memory cells including a leaker layer and a second memory cell region including a plurality of second memory cells, each of the plurality of second memory cells not including the leaker layer.

The plurality of first memory cells may include ferroelectric memory (FeRAM) cells operated across a first charge range, and the plurality of second memory cells may include FeRAM cells operated across a second charge range. The apparatus may also include a plurality of first digit lines coupled to respective ones of the plurality of first memory cells and a plurality of second digit lines coupled to respective ones of the plurality of second memory cells. As part of a read operation the plurality of first digit lines may be charged to a first reference voltage, and the plurality of second digit lines may be charged to a second reference voltage different than the first reference voltage. As part of a write operation, the same information may be written to more than one of the plurality of first memory cells.

In at least one aspect, the present disclosure may relate to an apparatus including a first memory cell region including a first plurality of digit lines coupled to respective ones of a first plurality of sense amplifiers and a second plurality of digit lines coupled to a ground voltage and a second memory cell region comprising a third plurality of digit lines coupled to respective ones of a second plurality of sense amplifiers.

As part of a read operation selected ones of the first plurality of digit lines may be charged to a first reference voltage, and selected ones of the second plurality of digit lines may be charged to a second reference voltage different than the first reference voltage.

The apparatus may also include a first memory deck including the first memory cell region and the second memory cell region and a second memory deck including a fourth plurality of digit lines. Each of the plurality of sense amplifiers may be coupled to a respective one of the first plurality of digit lines and a respective one of the fourth plurality of digit lines. Each of the plurality of sense amplifiers may have a first input terminal coupled to the respective one of the first plurality of digit lines and the respective one of the fourth plurality of digit lines. The first plurality of digit lines may be coupled to ferroelectric memory (FeRAM) cells which operate across a first charge range, and the third plurality of digit lines may be coupled to FeRAM cells which operate across a second charge range different than the first charge range.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus, comprising:
a first deck of a memory array including a first memory cell and second memory cell;
a second deck of the memory array including a third memory cell, wherein the second deck is stacked on the first deck;
a first sense amplifier configured to receive information from the first memory cell and the third memory cell; and
a second sense amplifier configured to receive information from the second memory cell, wherein
the first memory cell and the third memory cell are configured to store the same information.

2. An apparatus, comprising:
a first deck of a memory array including a first memory cell and second memory cell;
a second deck of the memory array including a third memory cell, wherein the second deck is stacked on the first deck;
a first sense amplifier configured to receive information from the first memory cell and the third memory cell;
a second sense amplifier configured to receive information from the second memory cell;
a first digit line coupled to the first memory cell;
a second digit line coupled to the second memory cell; and
a third digit line coupled to the third memory cell, wherein
the first sense amplifier is coupled to the first and the third digit lines, and the second sense amplifier is coupled to the second digit line,
the first deck further comprises a fourth digit line positioned adjacent to the first digit line, and
the fourth digit line is coupled to a ground voltage.

3. An apparatus, comprising:
a first deck of a memory array including a first memory cell and second memory cell;
a second deck of the memory array including a third memory cell, wherein the second deck is stacked on the first deck;
a first sense amplifier configured to receive information from the first memory cell and the third memory cell;
a second sense amplifier configured to receive information from the second memory cell;
a first digit line coupled to the first memory cell;
a second digit line coupled to the second memory cell; and
a third digit line coupled to the third memory cell, wherein
the first sense amplifier is coupled to the first and the third digit lines, and the second sense amplifier is coupled to the second digit line,
the first digit line and the third digit line are charged to a first reference voltage as part of a read operation, and
the second digit line is charged to a second reference voltage different than the first reference voltage as part of the read operation.

4. An apparatus, comprising:
a first deck of a memory array including a first memory cell and second memory cell;
a second deck of the memory array including a third memory cell, wherein the second deck is stacked on the first deck;
a first sense amplifier configured to receive information from the first memory cell and the third memory cell; and
a second sense amplifier configured to receive information from the second memory cell, wherein the first memory cell and the third memory cell are configured to operate over a first charge range, and the second memory cell is configured to operate over a second charge range.

5. The apparatus of claim 4, wherein the first, the second, and the third memory cells are ferroelectric memory (FeRAM) cells, and wherein the first charge range is in a dielectric region of the FeRAM cells.

6. An apparatus comprising:
a first memory cell in a first deck of a memory;
a second memory cell in a second deck of the memory:
a sense amplifier;
a first digit line coupled to the sense amplifier and to the first memory cell;
a second digit fine coupled to the sense amplifier and to the second memory cell;
a third digit line positioned adjacent to the first digit line; and
a fourth digit line positioned adjacent to the second digit line, wherein the third digit line and the fourth digit line are coupled to a ground voltage.

7. The apparatus of claim 6, further comprising:
a third memory cell in the first deck of the memory;
a second sense amplifier;
a third digit line coupled to the second sense amplifier and the third memory cell.

8. The apparatus of claim 6, further comprising a metal layer, wherein the first deck is stacked on the metal layer and the second deck is stacked on the first deck, and wherein a socket of the first digit line is shorted to a socket of the second digit line through the metal layer.

9. The apparatus of claim 6, wherein the first digit line and the second digit line are coupled to a first input terminal of the sense amplifier, and wherein the first memory cell and the second memory cell are configured to store the same value.

10. The apparatus of claim 6, wherein the first digit line is coupled to a first input terminal of the sense amplifier and the second digit line is coupled to a second input terminal of the sense amplifier, and wherein the first memory cell and the second memory cell are configured to store complimentary values.

11. The apparatus of claim 6, further comprising:
a first word line coupled to the first memory cell; and
a second word line coupled to the second memory cell, wherein the first word line and the second word line are activated responsive to a control signal.

12. An apparatus, comprising:
a first memory deck including a plurality of memory cells arranged at first intersections of a plurality of first word lines and a plurality of first digit lines;
a second memory deck stacked on the first memory deck, the second memory deck including a plurality of memory cells arranged at second intersections of a plurality of second word lines and a plurality of second digit lines; and
a plurality of sense amplifiers each coupled to one of the plurality of first digit lines and one of the plurality of second digit lines, wherein
each of the plurality of sense amplifiers includes a first input terminal and a second input terminal, and
the first input terminal is coupled to an associated one of the plurality of first digit lines and the second input terminal is coupled to an associated one of the plurality of second digit lines.

13. The apparatus of claim 12, further comprising a row decoder configured to provide a command signal which activates a selected one of the plurality of first word lines and a selected one of the plurality of second word lines.

14. An apparatus, comprising:
a first memory deck including a plurality of memory cells arranged at first intersections of a plurality of first word lines and a plurality of first digit lines;
a second memory deck stacked on the first memory deck, the second memory deck including a plurality of memory cells arranged at second intersections of a plurality of second word lines and a plurality of second digit lines; and
a plurality of sense amplifiers each coupled to one of the plurality of first digit lines and one of the plurality of second digit lines, wherein
the first memory deck further comprises a plurality of third digit lines, each of the plurality of first digit lines being adjacent to at least one of the plurality of third digit lines,
the second memory deck further comprises a plurality of fourth digit lines, each of the plurality of second digit lines being adjacent to at least one of the plurality of fourth digit lines, and
the plurality of third digit lines and the plurality of fourth digit lines are coupled to a ground voltage.

15. The apparatus of claim 14, wherein
each of the plurality of sense amplifiers includes a first input terminal, and
the first input terminal is coupled to an associated one of the plurality of first digit lines and to an associated one of the plurality of second digit lines.

16. An apparatus, comprising:
a first memory deck including a plurality of memory cells arranged at first intersections of a plurality of first word lines and a plurality of first digit lines;
a second memory deck stacked on the first memory deck, the second memory deck including a plurality of memory cells arranged at second intersections of a plurality of second word lines and a plurality of second digit lines; and
a plurality of sense amplifiers each coupled to one of the plurality of first digit lines and one of the plurality of second digit lines, wherein
the first memory deck further comprises a plurality of third digit lines,
selected ones of the plurality of first word lines and selected ones the plurality of second digit lines are charged to a first reference voltage as part of a read operation, and
selected ones of the plurality of third digit lines are charged to a second reference voltage different than the first reference voltage as part of the read operation.

17. An apparatus comprising:
a first memory deck comprising:
a first region including a first digit line;
a second region including a second digit line; and
a sense amplifier region positioned between the first region and the second region,
the sense amplifier region including a sense amplifier; and
a second memory deck stacked on the first memory deck, the second memory deck comprising:
a third region of a memory array including a third digit line; and
a fourth region of the memory array including a fourth digit line, wherein the sense amplifier is coupled to the first digit line and the second digit line.

18. The apparatus of claim 17, wherein the first digit line and the third digit line are coupled to a first input terminal of the sense amplifier and wherein the second digit line and the fourth digit line are coupled to a second input terminal of the sense amplifier.

19. The apparatus of claim 18, wherein as part of a read operation, the first digit line and the second digit line are coupled to respective memory cells, while the third digit line and the fourth digit line hold a reference voltage.

20. The apparatus of claim 18, wherein as part of a read operation, the first digit line, the second digit line, the third digit line, and the fourth digit line are all coupled to respective memory cells.

21. The apparatus of claim 17, wherein the first digit line is coupled to a first input terminal of the sense amplifier, and the second digit line is coupled to a second input terminal of the sense amplifier.

22. The apparatus of claim 17, further comprising:
a first word line which intersects the first digit line;
a second word line which intersects the second digit line;
a third word line which intersects the third digit line; and
a fourth word line which intersects the fourth digit line, wherein as part of a read operation the first word line and the third word line are activated by a first command signal.

23. The apparatus of claim 22, wherein the third word line and the fourth word line are activated responsive to the first command signal.

24. An apparatus comprising:
a first memory cell region comprising a first plurality of digit lines coupled to respective ones of a first plurality of sense amplifiers and a second plurality of digit lines coupled to a ground voltage; and
a second memory cell region comprising a third plurality of digit lines coupled to respective ones of a second plurality of sense amplifiers.

25. The apparatus of claim 24, wherein as part of a read operation selected ones of the first plurality of digit lines are charged to a first reference voltage, and selected ones of the second plurality of digit lines are charged to a second reference voltage different than the first reference voltage.

26. The apparatus of claim 24, further comprising:
a first memory deck including the first memory cell region and the second memory cell region;
a second memory deck including a fourth plurality of digit lines, wherein each of the plurality of sense amplifiers is coupled to a respective one of the first plurality of digit lines and a respective one of the fourth plurality of digit lines.

27. The apparatus of claim 26, wherein each of the plurality of sense amplifiers has a first input terminal coupled to the respective one of the first plurality of digit lines and the respective one of the fourth plurality of digit lines.

28. The apparatus of claim 24, wherein the first plurality of digit lines are coupled to ferroelectric memory (FeRAM) cells which operate across a first charge range, and wherein the third plurality of digit lines are coupled to FeRAM cells which operate across a second charge range different than the first charge range.

* * * * *